(12) United States Patent
Hieda

(10) Patent No.: US 6,373,085 B1
(45) Date of Patent: Apr. 16, 2002

(54) SEMICONDUCTOR MEMORY CELL HAVING TWO EPITAXIAL LAYERS AND ITS MANUFACTURING METHOD

(75) Inventor: Katsuhiko Hieda, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/216,835

(22) Filed: Dec. 21, 1998

(30) Foreign Application Priority Data

Dec. 22, 1997 (JP) .............................................. 9-353494

(51) Int. Cl.[7] ........................ H01L 27/108; H01L 29/76; H01L 29/94; H01L 31/119
(52) U.S. Cl. ........................................ 257/301; 257/302
(58) Field of Search ................................ 257/295–310; 438/240–253

(56) References Cited

U.S. PATENT DOCUMENTS

| 4,728,623 A | * | 3/1988 | Lu et al. ...................... 438/243 |
| 5,658,816 A | * | 8/1997 | Rajeevakumar ............. 438/386 |
| 5,792,685 A | * | 8/1998 | Hammerl et al. ........... 438/243 |
| 5,843,820 A | * | 12/1998 | Lu ............................... 438/243 |
| 5,914,510 A | | 6/1999 | Hieda .......................... 257/301 |
| 5,936,271 A | * | 8/1999 | Alsmeier et al. ............ 257/301 |
| 5,998,821 A | | 12/1999 | Hieda .......................... 257/301 |
| 6,013,937 A | * | 1/2000 | Beintner et al. ............. 438/296 |

OTHER PUBLICATIONS

U.S. application No. 08/982,478 filed Dec. 2, 1997.
N. Lu et al., "A Buried–Trench DRAM Cell Using a Self–aligned Epitaxy Over Trench Technology", IEDM Technical Digest, pp. 588–591 (Dec. 1988).

* cited by examiner

Primary Examiner—Tom Thomas
Assistant Examiner—Cuong Quang Nguyen
(74) Attorney, Agent, or Firm—Finnegan, Henderson, Farabow, Garrett, & Dunner, L.L.P.

(57) ABSTRACT

A memory cell incorporated in a dynamic RAM is disclosed. The memory cell comprises a capacitor having a storage electrode formed in a trench, a first semiconductor layer formed on the capacitor, a connection member formed in the hole, a second semiconductor layer formed on the first semiconductor layer and the connection member, and a transistor formed in the second semiconductor layer. One of the source and the drain of the transistor is connected to the connection member in a direction of lamination of the substrate and the layers.

21 Claims, 16 Drawing Sheets

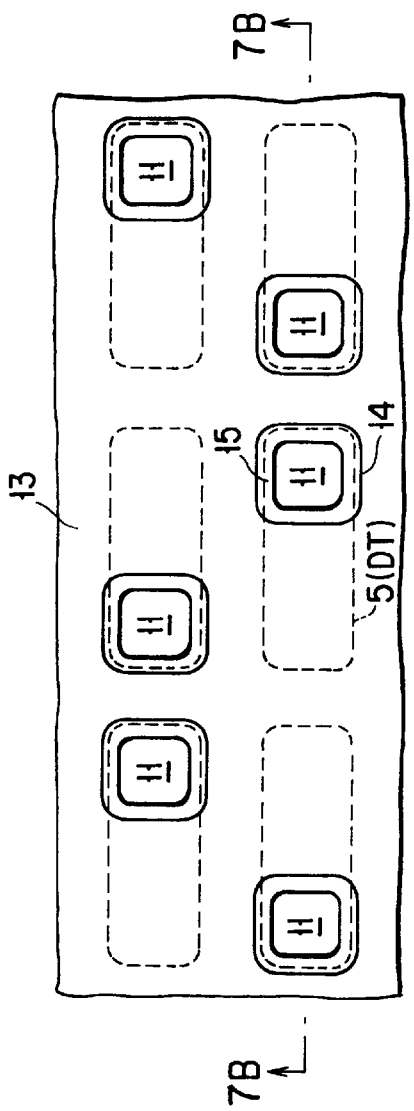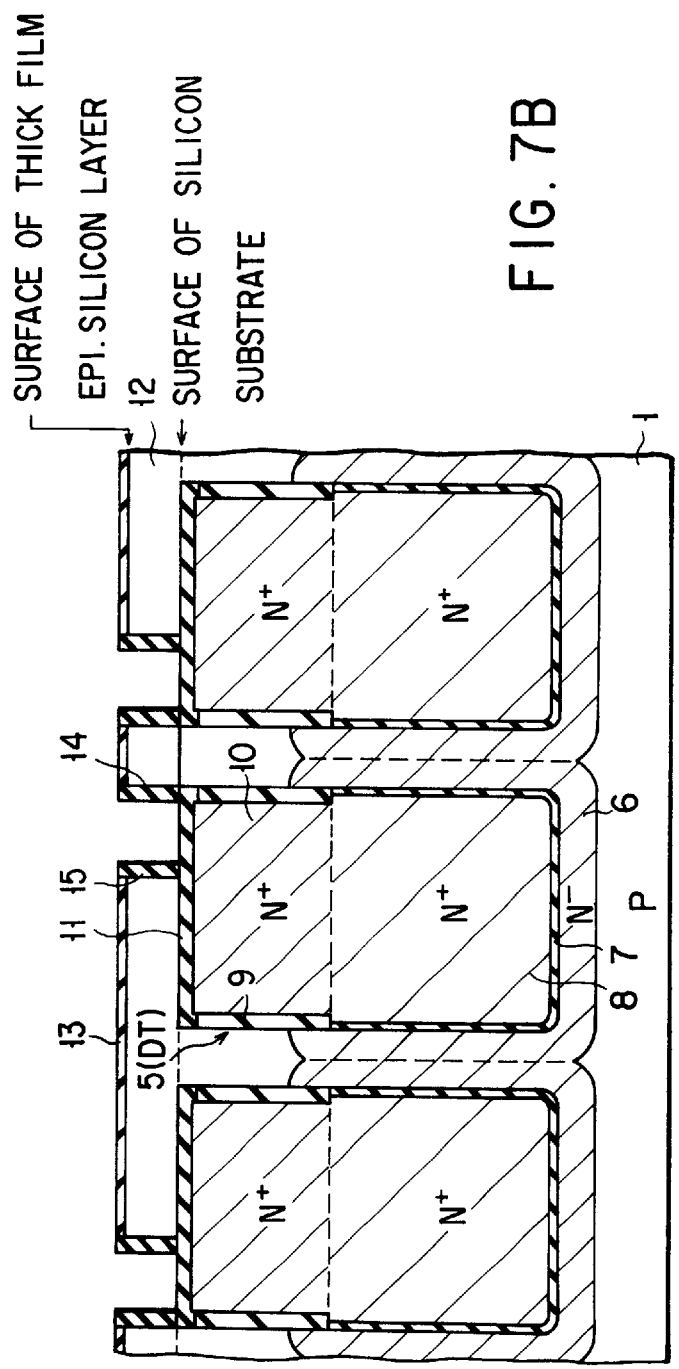

SEMICONDUCTOR MEMORY CELL HAVING TWO EPITAXIAL LAYERS AND ITS MANUFACTURING METHOD

BACKGROUND OF THE INVENTION

This invention relates to a semiconductor memory device having a memory cell constituted of a transistor and a capacitor, and more particularly to a semiconductor memory device of a structure in which a transistor is formed above a capacitor, and also to a method for manufacturing the device.

In semiconductor memory devices such as DRAMs having a memory cell formed of a MOS transistor and capacitor, their capacitor structures have been being formed three-dimensional in order to increase the is capacitor area. The three-dimensional capacitor structures include a trench capacitor. The trench capacitor is mainly formed of side surfaces of a trench which is formed in a silicon substrate. The trench capacitor has a superior flatness to, for example, a stacked-type capacitor, and is now being developed for 256-Mbit or 1-Gbit DRAMs.

Also in the case of the trench capacitor, to secure a sufficient trench side-surface area is becoming difficult in accordance with miniaturization of memory cells. This is partially because the trench capacitor is arranged adjacent and parallel to a MOS transistor, and hence the smaller the area of each memory cell, the smaller the trench diameter.

As an attempt to solve this problem, IEDM'88 Technical Digest, pp.588–591, "A Buried-Trench DRAM Cell Using Self-Aligned Epitaxy Over Trench Technology" (document A) discloses formation of a transistor on a trench capacitor to secure a sufficient trench diameter.

The technique disclosed in the above document (A) is excellent, in which an epitaxial Si layer for forming a transistor is grown on a trench capacitor using self-aligned epitaxy, and one of the drain and source of the transistor is electrically connected to the storage electrode of the capacitor.

In this technique, however, it is difficult to control the crystal growth of the epitaxial Si layer for forming the transistor, which means that it is difficult to secure an epitaxial Si layer of an excellent quality. This is because the epitaxial Si layer is formed on a silicon dioxide film which is provided on the trench capacitor. Accordingly, it is very difficult to form high quality transistors over the entire wafer.

In addition, the connection between the one of the source and drain of the transistor and the storage electrode of the capacitor is a buried strap connection using diffusion of an impurity contained in the storage electrode. Since the buried strap connection uses only impurity diffusion, the connection is not reliable, and the process for realizing the connection is not stable, which may result in a low product yield.

BRIEF SUMMARY OF THE INVENTION

This invention has been developed under the above-described circumstances, and is aimed at providing a semiconductor integrated circuit device in which a high quality semiconductor layer is formed for a transistor, and the connection between one of the source and drain of the transistor and the storage electrode of a capacitor is stabilized, and also providing its manufacturing method.

To attain the aim, there is provided a semiconductor integrated circuit device comprising:

a semiconductor substrate having a trench;

a capacitor having a storage electrode formed in the trench;

a first semiconductor layer formed on the semiconductor substrate and the capacitor, the first semiconductor layer being electrically isolated from the storage electrode and having a hole extending to the storage electrode;

a connection member formed in the hole and electrically isolated from the first semiconductor layer in a substrate in-plane direction;

a second semiconductor layer formed on the first semiconductor layer and the connection member; and a transistor formed in the second semiconductor layer, and having a source and a drain, one of the source and the drain being connected to the connection member in a direction of lamination of the substrate and the layers.

In the semiconductor integrated circuit device constructed as above, the second semiconductor layer is formed on the first semiconductor layer. This means that a two-stage epitaxial growth method can be used. The two-stage epitaxial growth method can reduce, in particular, the defect level of the second semiconductor layer. Accordingly, the semiconductor layer in which a transistor is formed can be made to have a high quality.

Further, one of the source and the drain is connected to the connection member in a direction of lamination of the substrate and the layers. Accordingly, one of the source and the drain can be directly connected to the top surface of the connection member. In other words, one of the source and the drain can be connected to the connection member by surface strap. The surface strap structure can achieve more reliable connection than a buried strap structure as disclosed in the aforementioned document (A), which uses only diffusion of an impurity contained in the storage electrode. Thus, stable connection can be realized between one of the source and the drain and the connection member (storage electrode).

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7A is a plan view, useful in explaining a method for manufacturing the DRAM of the first embodiment invention;

FIG. 7B is a sectional view, taken along the line 7B—7B of FIG. 7A;

DETAILED DESCRIPTION OF THE INVENTION

Figure 1A:
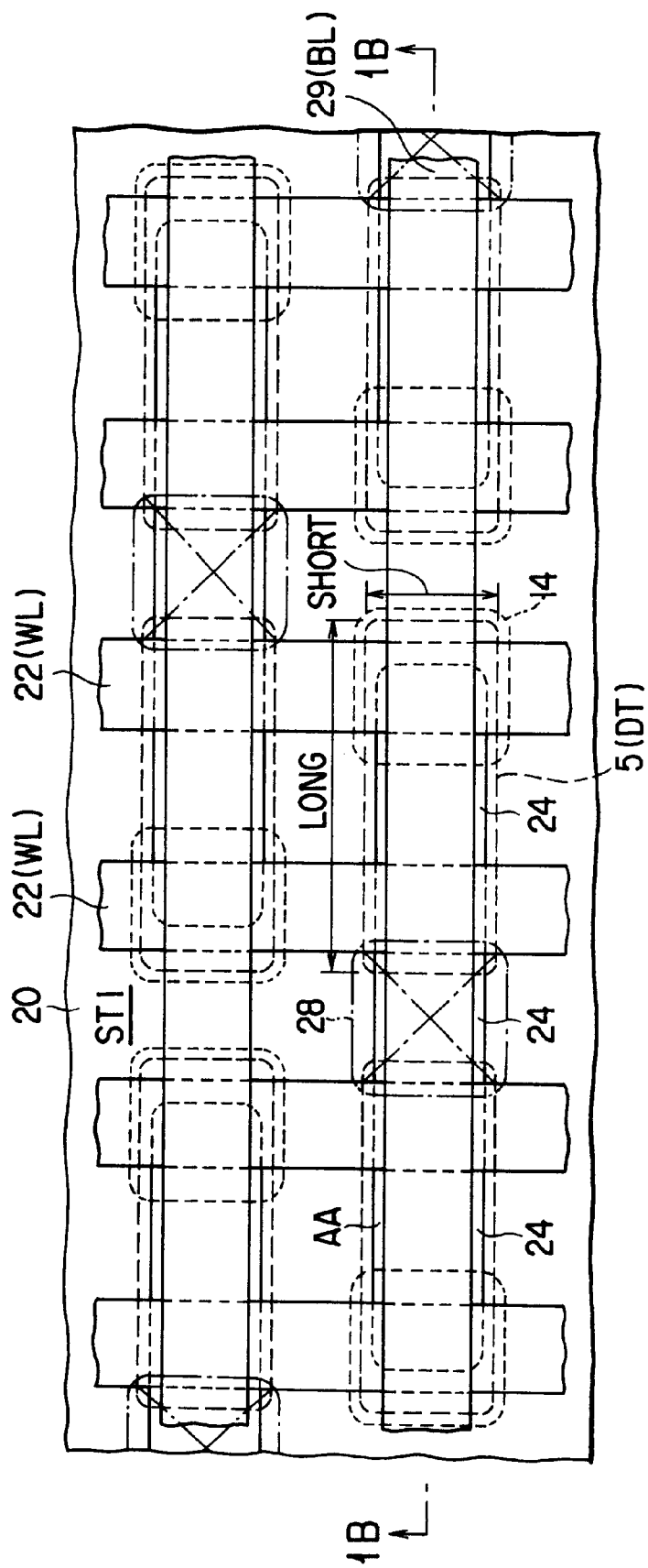
FIG. 1A is a plan view, showing a DRAM according to a first embodiment of the invention.

The embodiments of the invention will be described with reference to the accompanying drawings. In the drawings, like reference numerals denote like elements.

First Embodiment

Figure 1B:
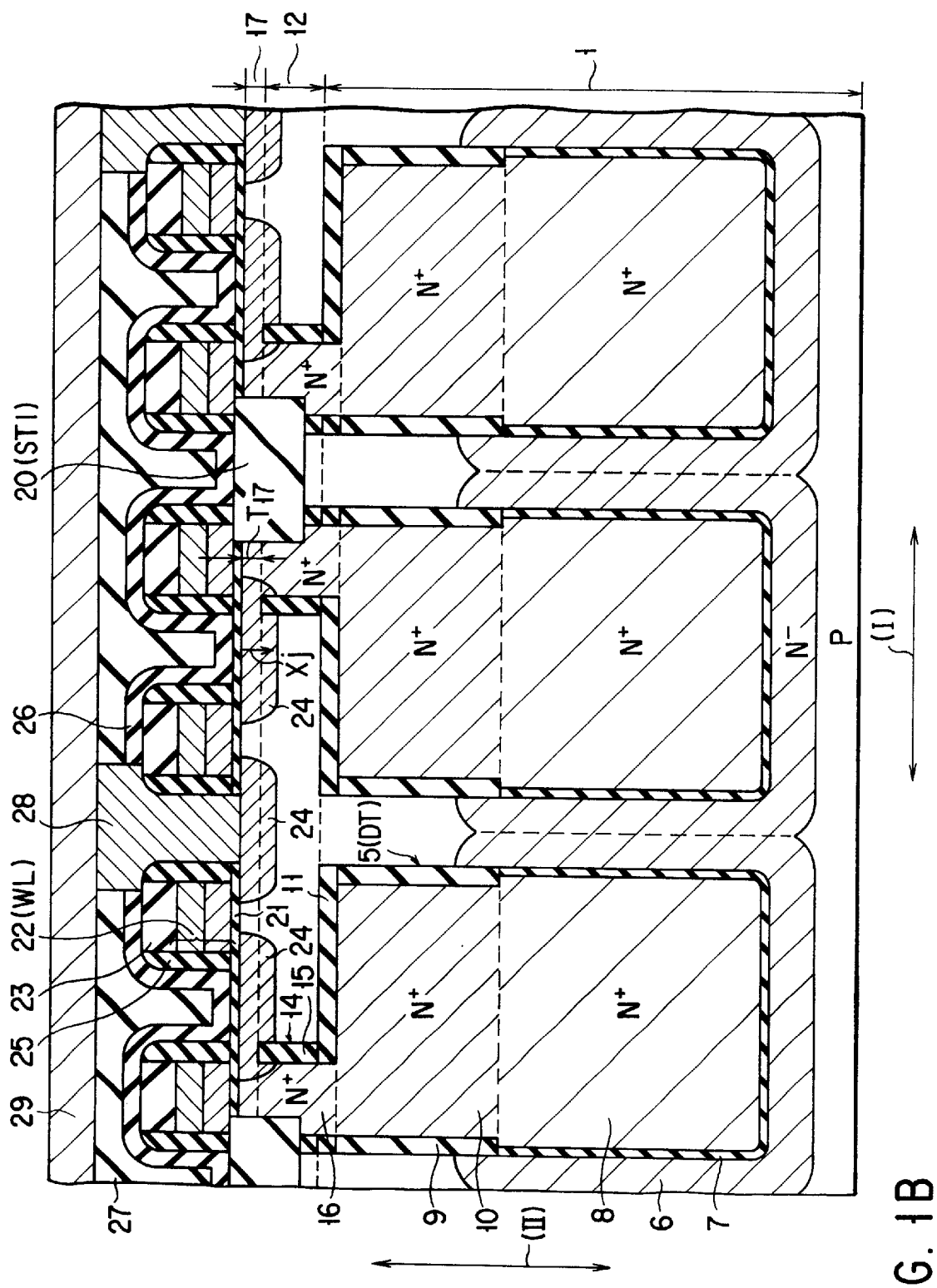
FIG. 1B is a sectional view, taken along the line 1B—1B of FIG. 1A.

FIG. 1A is a plan view, showing a DRAM according to a first embodiment of the invention, while FIG. 1B is a sectional view, taken along the line 1B—1B of FIG. 1A. FIGS. 1A and 1B show a memory cell array particularly employed in a DRAM.

As is shown in FIGS. 1A and 1B, deep trenches (DT) 5 are formed in surface portions of a p-type silicon substrate 1. The substrate has (100) orientation and a p-type impurity concentration of about 1 to $5 \times 10^{15}$ cm$^{-3}$. An N$^+$-type polysilicon film (storage electrode) 8 is buried in a lower space of each DT 5 with a capacitor insulating film 7 interposed therebetween. An N$^-$-type diffusion layer (plate electrode) 6 is formed in a portion of the substrate 1 opposed to the polysilicon film 8. The diffusion layer 6, the capacitor insulating film 7 and the polysilicon film 8 constitute a trench capacitor. An N$^+$-type polysilicon film 10 is buried in an upper space of each DT 5 with a collar oxide film 9 interposed therebetween. A stopper insulating film 11 is provided on the polysilicon film 10. The stopper insulating film 11 is formed of, for example, a silicon nitride (SiN) film.

A thick epitaxial Si layer (a first semiconductor layer) 12 is formed on the substrate 1 and the trench capacitors. In this embodiment, the surface of the epitaxial layer 12 is planarized. Connection holes 14 are formed in the epitaxial silicon layer 12 such that it reaches the polysilicon film 10. A connection member 16 is provided in each connection hole 14 with a side wall insulating film 15 interposed therebetween. The side wall insulating film 15 is, for example, a silicon oxide film. The connection member 16 is, for example, an N$^+$-type polysilicon film, and is isolated from the epitaxial layer 12 by the side wall insulating film 15 in a substrate in-plane direction as indicated by arrow (I) in FIG. 1B and parallel to the surface of the substrate.

A thin film epitaxial Si layer (a second semiconductor layer) 17 is provided on the top surface of the epitaxial Si layer 12 and the top surface of each connection member 16. The epitaxial Si layer 17 is thinner than the epitaxial Si layer 12. Shallow trench isolations (SIT) 20 are formed in portions of the epitaxial Si layers 12 and 17. Each STI 20 is an element isolating region which defines an active area (AA) in the surface of the semiconductor substrate of a lamination structure comprising the substrate 1 and the epitaxial layers 12 and 17.

Gate electrodes 22 are provided on the epitaxial Si layer 17 via gate oxide films 21. The gate electrodes 22 constitute word lines (WL). Cap insulating films 23 are formed on the gate electrodes 22. The gate insulating film 21 are formed of, for example, thermally oxidized films, and the cap insulating films 23 of, for example, silicon nitride films. Each pair of the gate electrodes 22 and the cap insulating films 23 constitute a lamination structure corresponding to the gate electrode pattern (word line pattern). Side wall insulating films 25 are formed on the side surfaces of the lamination structure. The side wall insulating films are formed of silicon nitride films.

N-type source/drain diffusion layers 24 are formed in the epitaxial Si layer 17. One of the source/drain diffusion layers 24 is connected to the connection member 16 in a direction of lamination. The direction of lamination is indicated by arrow (II) of FIG. 1B, i.e. it is vertical to the surface of the substrate 1. In this embodiment, the depth (junction depth) Xj to the source/drain diffusion layer junctions 24 is greater than the depth $T_{17}$ from the surface of the epitaxial Si layer 17 to the top surface of the connection member 16.

Each gate oxide film 21, gate electrode 22 and source/drain diffusion layers 24 constitute a MOS transistor.

A stopper insulating film 26 is provided on a portion of the semiconductor substrate in which a transistor is formed. The stopper insulating film 26 is, for example, a silicon nitride film. An interlayer insulating film 27 is formed on the stopper insulating film 26. The interlayer insulating film 27 is, for example, a boron-phosphor-silicate glass (BPSG) film, and has its surface planarized. Contact holes are formed in the stopper insulating film 26 and the interlayer insulating film 27 such that each of the holes reaches the other of a corresponding pair of the source/drain diffusion layers 24. A bit line contact 28 is provided in each contact hole. A bit line 29 is provided on the interlayer insulating film 27, and connected to the other of the source/drain diffusion layers 24 via the bit line contact 28. Each transistor shown in FIGS. 1A and 1B is a transfer transistor which responds to the potential of the gate electrode (WL) 22 for electrically connecting the polysilicon film (storage electrode) 8 to the bit line (BL).

A method for manufacturing the DRAM according to the first embodiment will be described with reference to FIGS. 2A to 11B.

FIGS. 2A to 11A are plan views, useful in explaining a method for manufacturing the DRAM of the first embodiment of the invention, and FIGS. 2B to 11B are sectional views taken along lines 2B—2B, 3B—3B, 4B—4B, 5B—5B, 6B—6B, 7B—7B, 8B—8B, 9B—9B, 10B—10B and 11B—11B of FIGS. 2A to 11A.

Figure 2A:
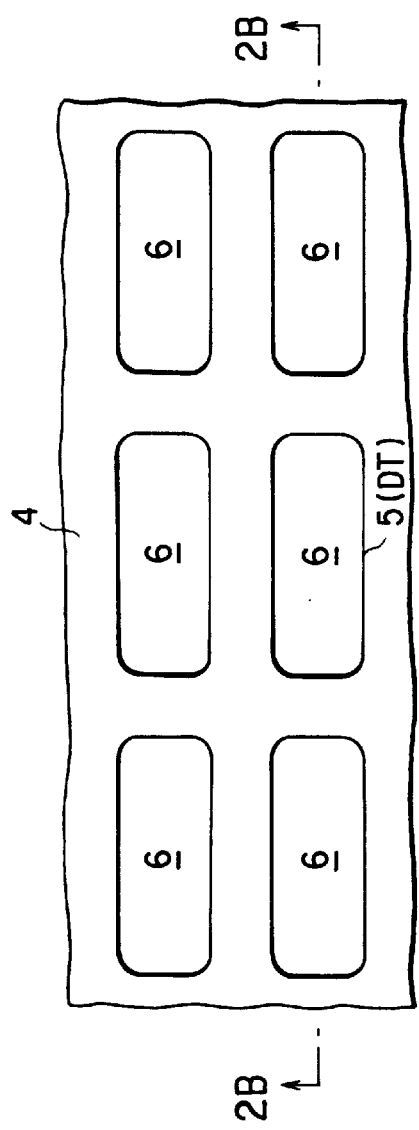
FIG. 2A is a plan view, useful in explaining a method for manufacturing the DRAM of the first embodiment of the invention.
Figure 2B:
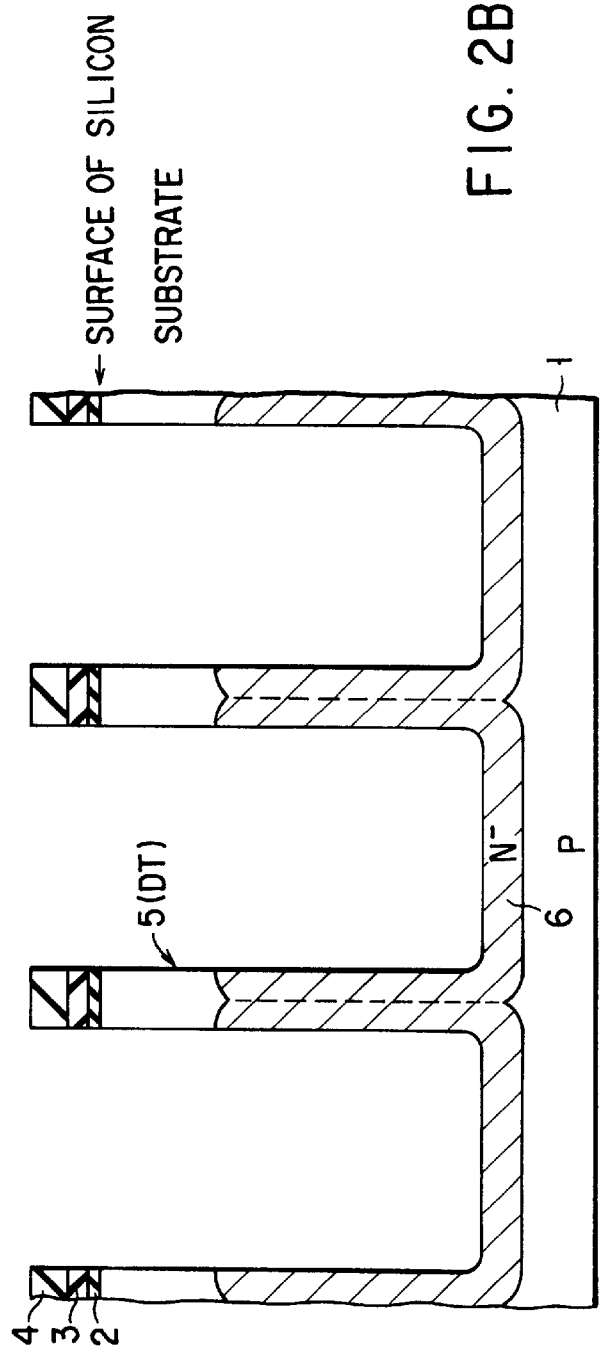
FIG. 2B is a sectional view taken along the line 2B—2B of FIG. 2A.

First, the semiconductor substrate 1 is prepared as shown in FIGS. 2A and 2B. An example of the substrate 1 is a P-type silicon substrate which has an impurity concentration of about 1 to $5 \times 10^{15}$ cm$^{-3}$ and (100) orientation. Alternatively, an epitaxial substrate obtained by forming a P-type epitaxial Si layer with a thickness of about 1 $\mu$m on a P-type silicon substrate may be used.

Then, a P-type well (not shown) is formed in the portion of the substrate 1 in which an N-channel MOS transistor is formed, and an N-type well (not shown) is formed in the portion of the substrate 1 in which a P-channel MOS transistor is formed.

After that, a multilayered mask is formed on the substrate 1. The multilayered mask comprises a thermally oxidized film (buffer oxide film) 2 with a thickness of about 8 nm, a silicon nitride film 3 with a thickness of about 150 nm, and a silicon dioxide film 4 with a thickness of about 700 nm. The silicon dioxide film 4 is preferably a CVD-TEOS film. The CVD-TEOS film is formed by CVD using TEOS as a reactive gas. Subsequently, a window is formed in the multilayered mask for forming a deep trench (DT). The substrate 1 is etched using the multilayered mask as an obstacle, thereby forming a DT 5 with a depth of about 5.0 $\mu$m. Then, an N$^-$-type diffusion layer 6 is formed on each portion of the substrate 1 which is exposed in a corresponding DT 5. The N$^-$-type diffusion layer 6 is formed in the substrate 1 except for upper side surfaces of the DT 5 by solid phase diffusion using arsenic (As) glass. The depth of the diffusion layer 6 is about 0.2 $\mu$m. This layer 6 may be formed by solid phase diffusion using phosphor-silicate glass (PSG) which contains phosphor (P). After that, the portions of the substrate 1 which are exposed in the DTs 5 are cleaned.

Figure 3A:
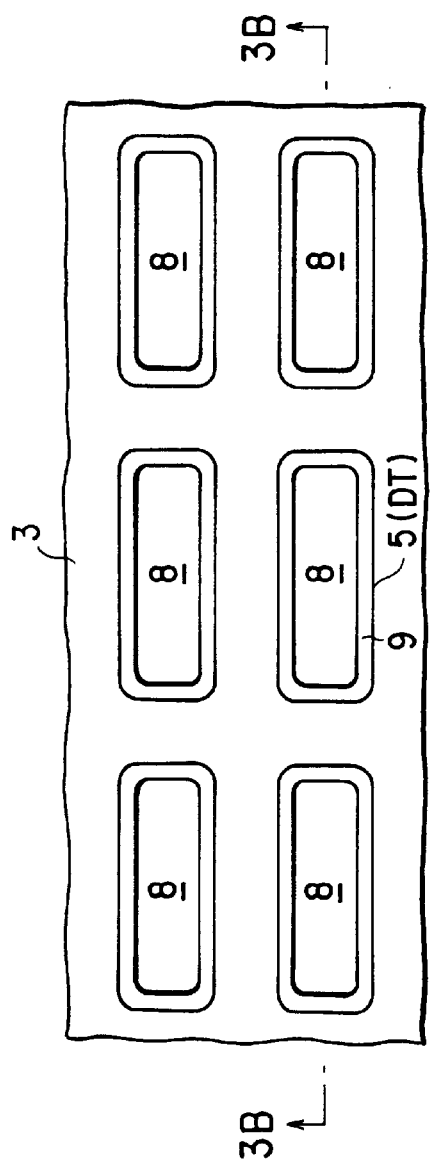
FIG. 3A is a plan view, useful in explaining a method for manufacturing the DRAM of the first embodiment invention.
Figure 3B:
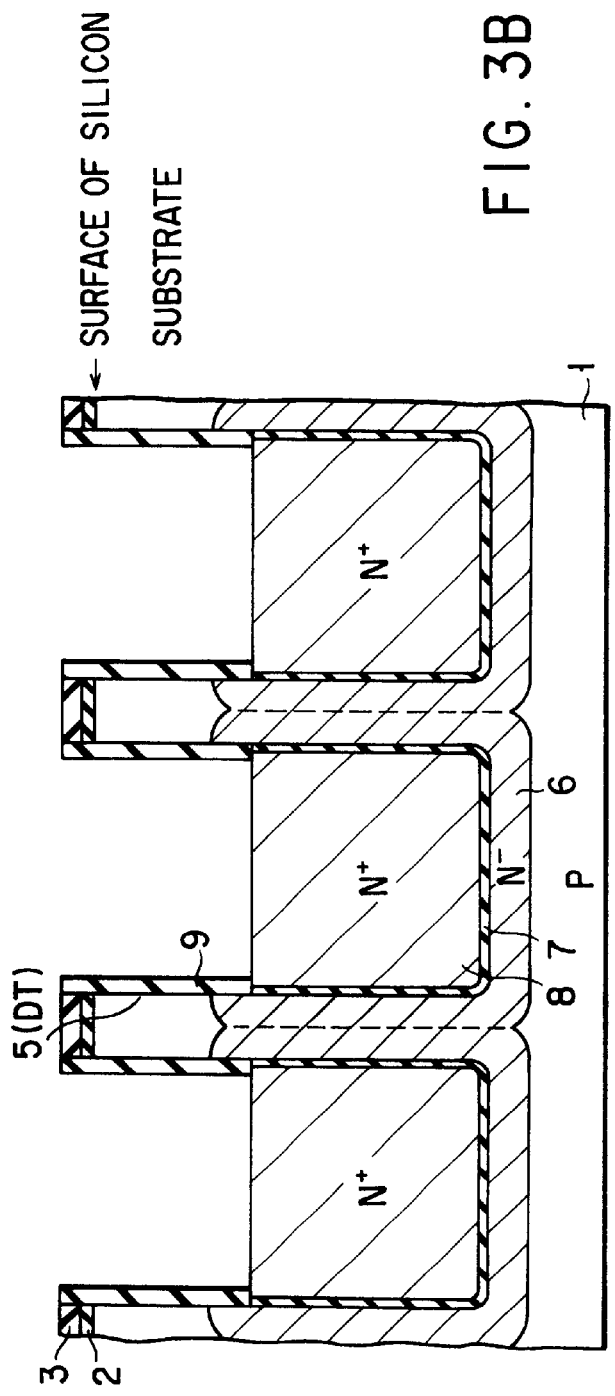
FIG. 3B is a sectional view, taken along the line 3B—3B of FIG. 3A.

Thereafter, capacitor insulating films 7 are formed on the portions of the substrate 1 which are exposed in the DTs 5, as is shown in FIGS. 3A and 3B. A lamination film of a silicon nitride film and a silicon dioxide film is used as each capacitor insulating film 7. In the case of using the lamination film, the thickness of the lamination film is adjusted to a value which is substantially equivalent to the thickness of 4.0 nm of the silicon dioxide film. Since the capacitor insulating film 7 consisting of the silicon nitride film and the silicon dioxide film can stand even a high temperature process of about 1000° C. performed after the formation of the trench capacitor, it is advantageous to a transistor forming process after the capacitor forming process. After that, N$^+$-type polysilicon doped with an N-type impurity (e.g. arsenic) of a high concentration is deposited on the substrate 1 to form an N$^+$-type polysilicon film. Subsequently, the N$^+$-type polysilicon film is buried in each DT 5 using CMP and RIE, thereby forming a first storage electrode 8. The first storage electrode 8 in the DT 5 is at a level lower about 1.0 $\mu$m than the top surface of the substrate 1. Subsequently, the capacitor insulating film 7 exposed in the DT 5 is removed using the first storage electrode 8 as a mask. Then, silicon dioxide is deposited on the substrate 1 by CVD using TEOS as a reactive gas, thereby forming a CVD-TEOS film. The CVD-TEOS film is then etched by RIE, thereby forming a collar oxide film 9 with a thickness of about 40 nm on the side walls of the DT 5.

Figure 4A:
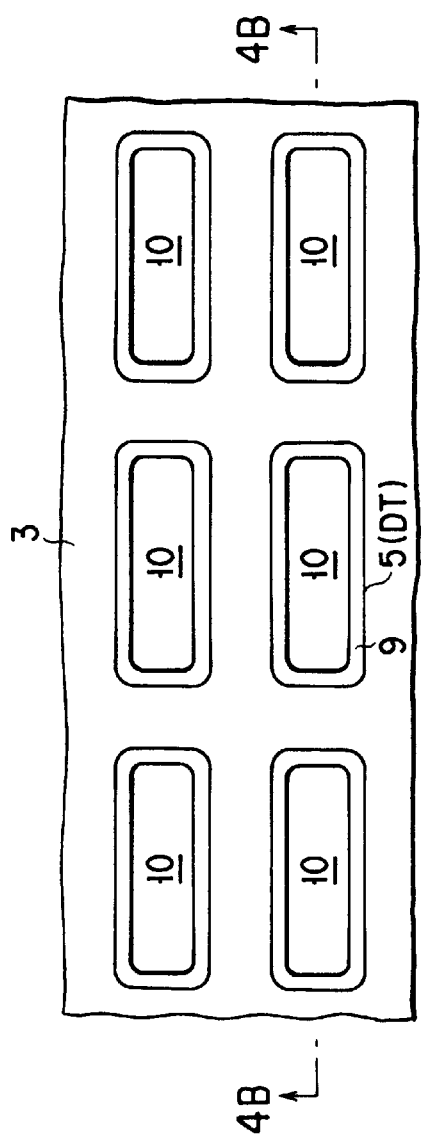
FIG. 4A is a plan view, useful in explaining a method for manufacturing the DRAM of the first embodiment invention.
Figure 4B:
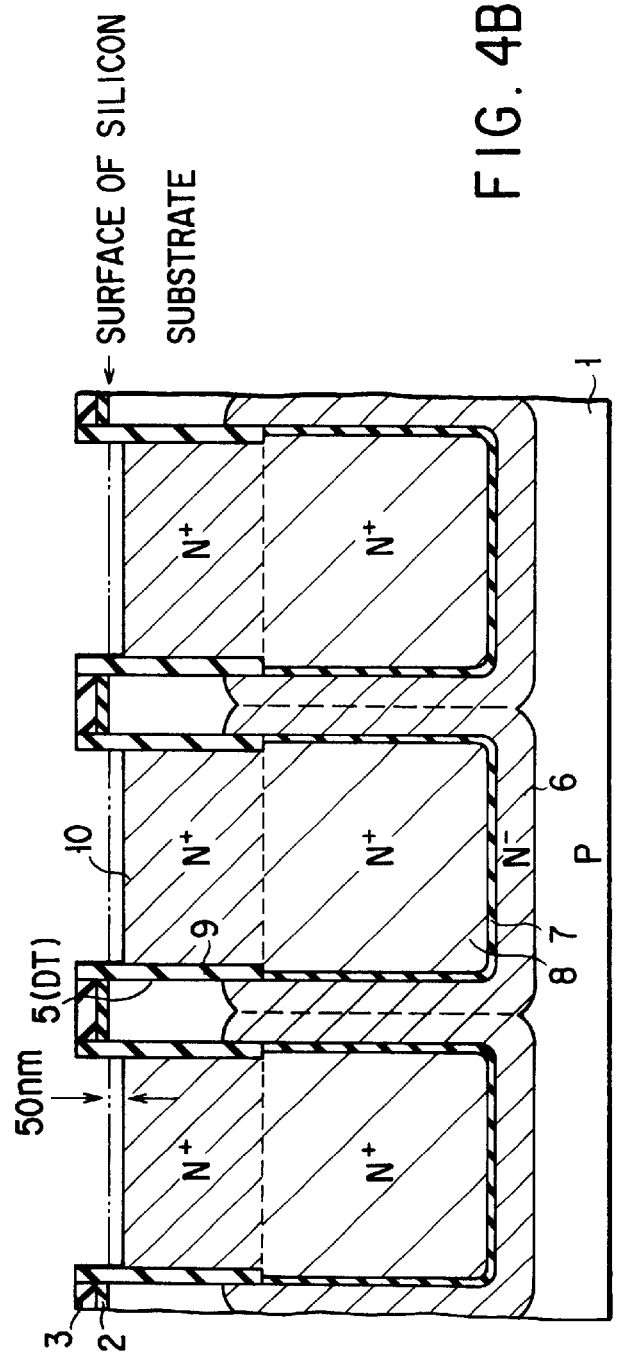
FIG. 4B is a sectional view, taken along the line 4B—4B of FIG. 4A.

After that, N$^+$-type polysilicon highly doped with an N-type impurity such as arsenic is deposited on the substrate 1 as shown in FIGS. 4A and 4B, thereby forming an N$^+$-type polysilicon film. The N$^+$-type polysilicon film is buried in each DT 5 using CMP and RIE, thereby forming a second storage electrode 10. The second storage electrode 10 in the DT 5 is at a level lower about 50 nm than the top surface of the substrate 1. The level difference of about 50 nm between the second storage electrode 10 and the top surface of the substrate 1 is for obtaining an alignment signal of a sufficient level from each DT mark in a process successive to that process.

Figure 5A:
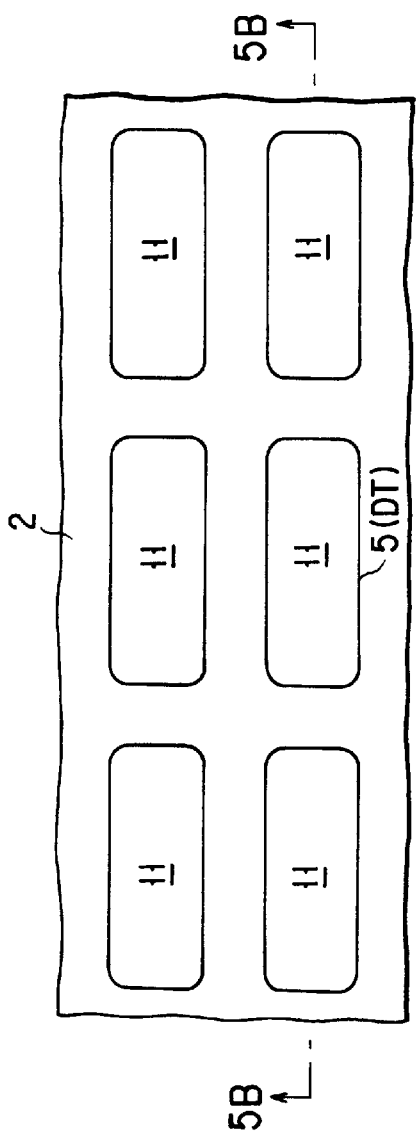
FIG. 5A is a plan view, useful in explaining a method for manufacturing the DRAM of the first embodiment invention.
Figure 5B:
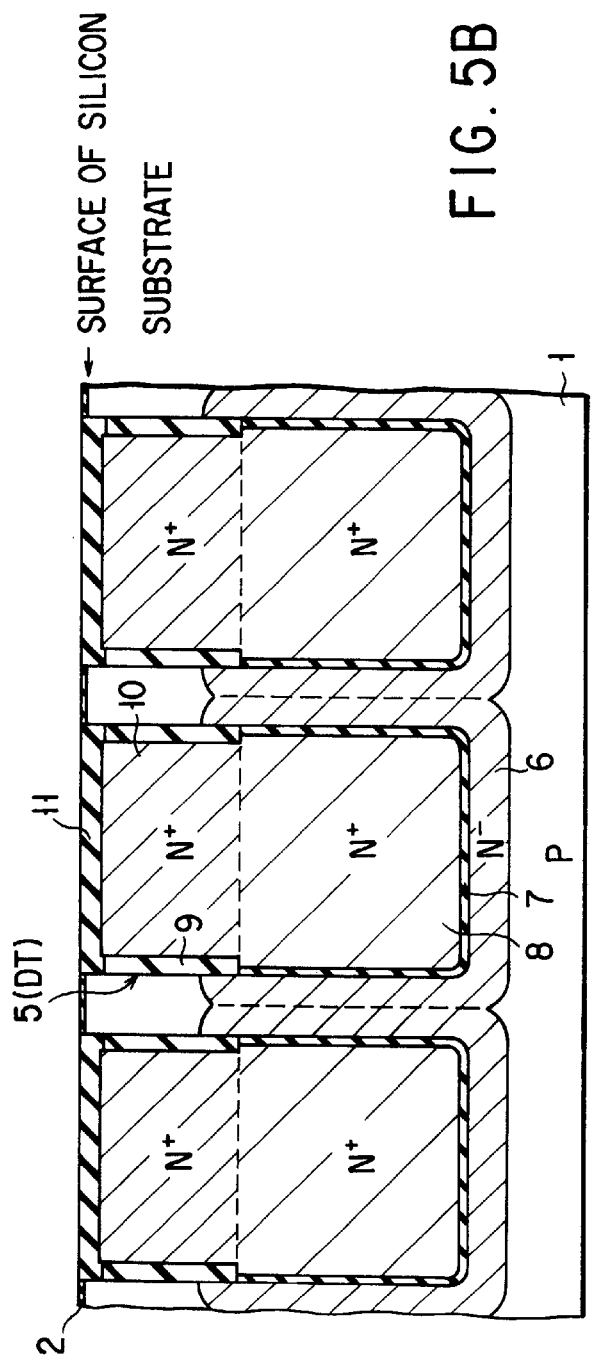
FIG. 5B is a sectional view, taken along the line 5B—5B of FIG. 5A.

Thereafter, as is shown in FIGS. 5A and 5B, the portion of the collar film 9 which is exposed to the top surface of the substrate 1 is removed, and only those portions of the film 9 which are provided on the side walls of the DTs 5 are left, using the second storage electrodes 10 and the silicon nitride films 3 as masks. Subsequently, the silicon nitride films 3 are removed, and silicon nitride is deposited on the entire top surface of the substrate 1 to, for example, about 100 nm thick, thereby forming a silicon nitride film. This silicon nitride silicon is buried in the DTs 5 using CMP, thereby forming stopper SiN films 11.

Figure 6A:
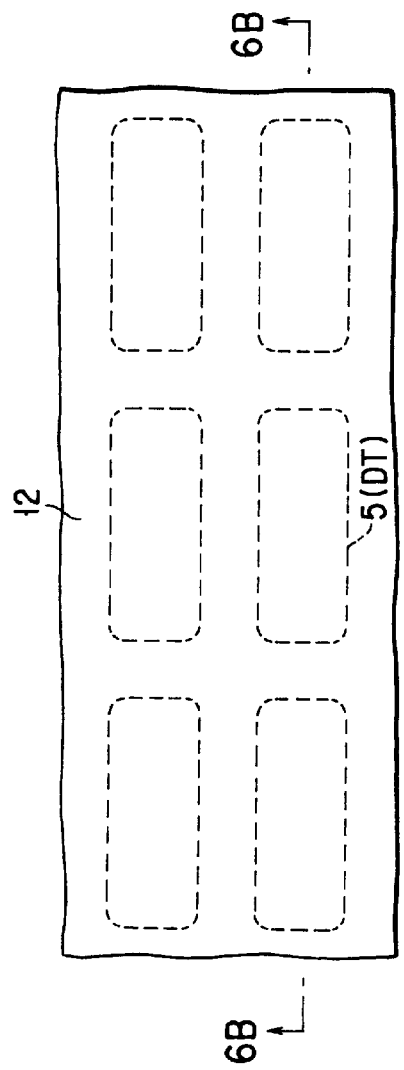
FIG. 6A is a plan view, useful in explaining a method for manufacturing the DRAM of the first embodiment invention.
Figure 6B:
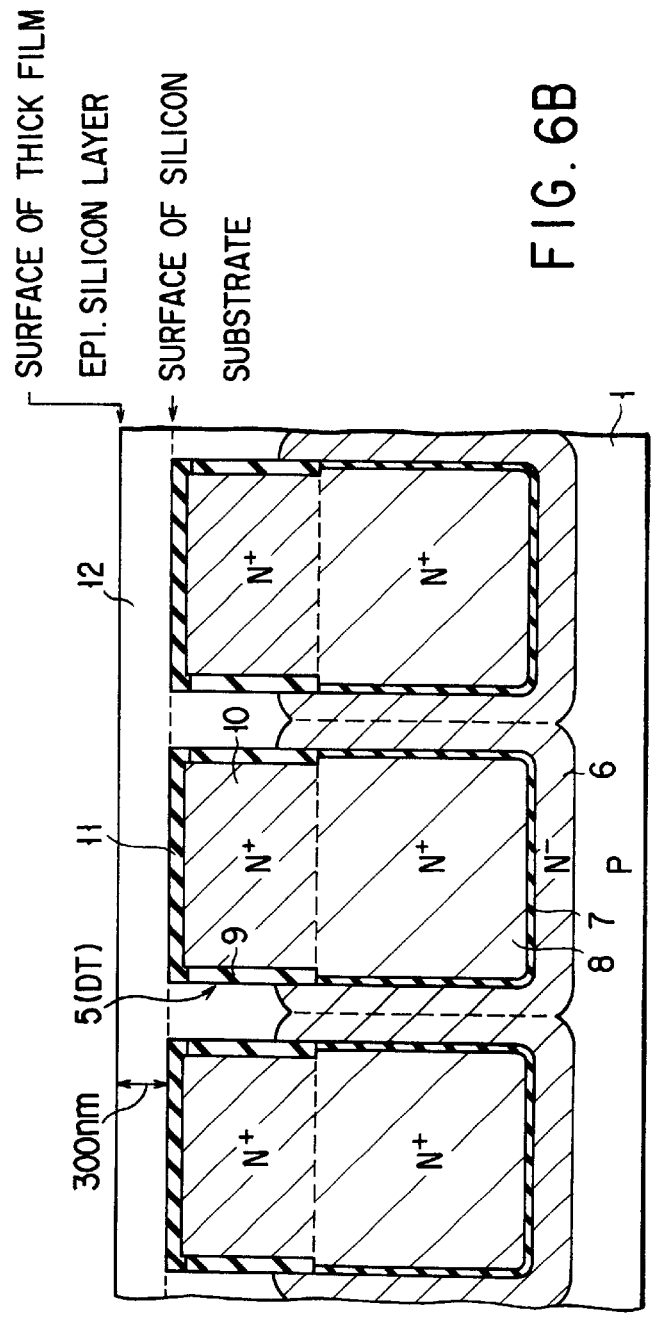
FIG. 6B is a sectional view, taken along the line 6B—6B of FIG. 6A.

The thermal oxide film 2 and a naturally oxidized film are removed to expose the surface of the substrate 1, and then a first epitaxial Si layer 12 is grown on the entire surface of the resultant structure as shown in FIGS. 6A and 6B. On the stopper SiN films 11, silicon is epitaxially grown from those portions of the substrate 1 which are adjacent to the films 11. Alternatively, the epitaxial Si layer 12 may be formed by depositing silicon to form an amorphous silicon layer, and then re-crystallizing the amorphous silicon layer by a heat treatment. The epitaxial Si layer 12 has a thickness of, for example, about 300 nm. If necessary, the surface of the epitaxially grown silicon may be subjected to CMP, thereby removing the unevenness of the surface of the epitaxial Si layer 12. In this case, those facets, for example, of the epitaxial Si layer 12 which may occur above the DT 5 can be removed, which can enhance the quality of an epitaxial Si layer 17 which will be formed by second epitaxial growth. Since the epitaxial Si layer 12 is also formed on the stopper SiN films 11, it must have a thickness at least greater than half the length of the short side of the DT 5.

After that, a SiO$_2$ film 13 with a thickness of, for example, about 50 nm is formed on the epitaxial Si layer 12 as shown in FIGS. 7A and 7B. Then, a connection hole 14 is formed using lithography and RIE such that its area is completely included in the area of each DT 5. Preferably, the connection hole 14 is formed after the formation of the SiO$_2$ film 13. This is because contamination, for example, of the epitaxial Si layer 12 can be avoided in the resist forming process and etching process for forming the connection hole 14. Moreover, it is preferable that the etching for forming the connection hole 14 is performed under the conditions which enable stop of the etching on the stopper SiN film 11. In other words, it is preferable that the etching is performed under the conditions which make it difficult to etch the silicon nitride film. Subsequently, a side wall SiO$_2$ film 15 is formed on the side walls of each connection hole 14. Specifically, the side wall film 15 is formed by depositing silicon dioxide to about 40 nm thick on the substrate 1 using CVD to thereby form an SiO$_2$ film, and then subjecting the SiO$_2$ film to RIE to leave the film only on the side walls of the connection hole 14. The side walls SiO$_2$ film 15 serves to electrically isolate the connection hole 15 from the first epitaxial Si layer 12, and also to prevent conduction of a parasitic transistor formed in a direction of lamination. To these ends, it is necessary to make the epitaxial Si layer 12 thick to some extent (about 30 nm).

Figure 8A:
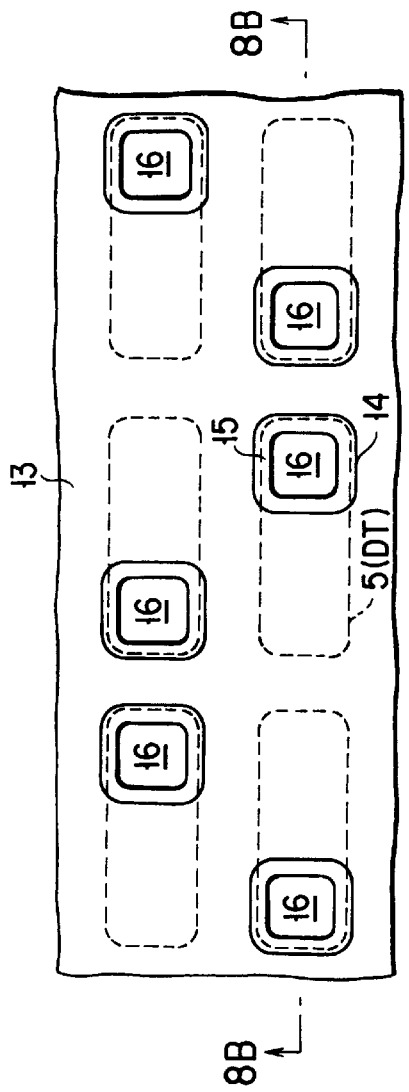
FIG. 8A is a plan view, useful in explaining a method for manufacturing the DRAM of the first embodiment invention.
Figure 8B:
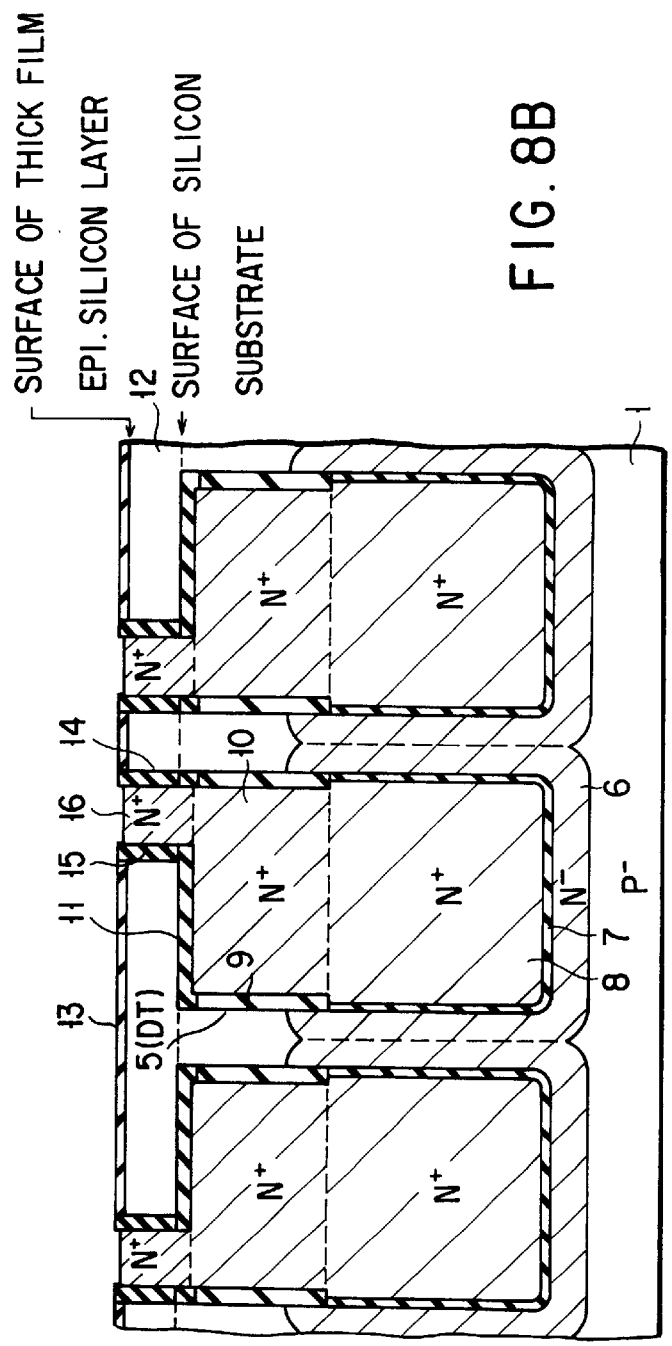
FIG. 8B is a sectional view, taken along the line 8B—8B of FIG. 8A.

Then, as shown in FIGS. 8A and 8B, that portion of each stopper SiN film 11 which is exposed as the bottom of a corresponding connection hole 14 is removed by, for example, RIE, thereby exposing the surface of the storage electrode 10. N$^+$-type polysilicon highly doped with an N-type impurity such as arsenic is deposited on the substrate 1, thereby forming an N$^+$-type polysilicon film. The N$^+$-type polysilicon film is buried in each connection hole 14 using CMP and RIE, thereby forming a connection member 16. At this time, the SiO$_2$ film 13 also serves to protect the surface of the epitaxial Si layer 12 during CMP and RIE.

Figure 9A:
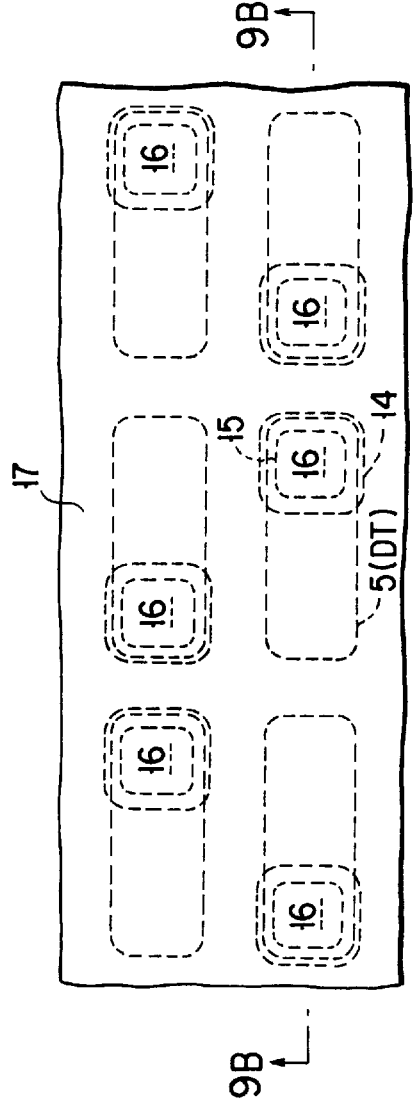
FIG. 9A is a plan view, useful in explaining a method for manufacturing the DRAM of the first embodiment invention.
Figure 9B:
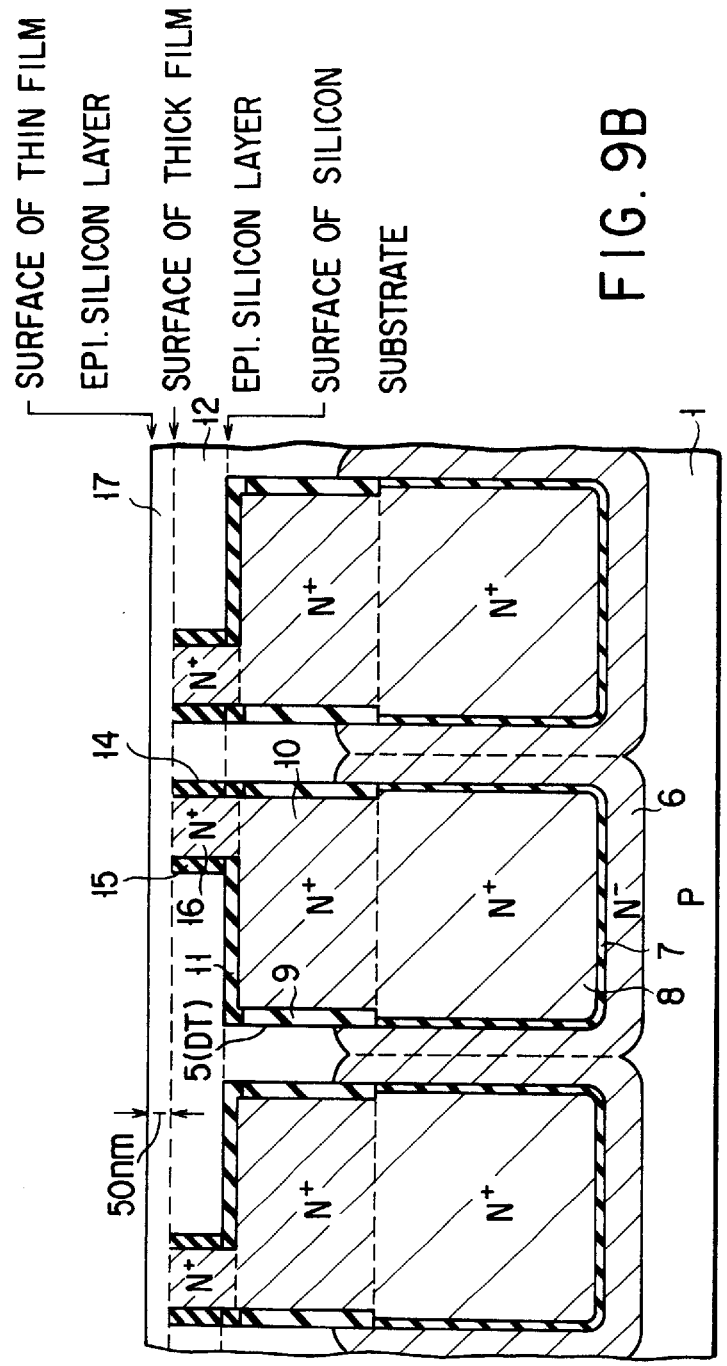
FIG. 9B is a sectional view, taken along the line 9B—9B of FIG. 9A.

Thereafter, as is shown in FIGS. 9A and 9B, the SiO$_2$ film 13 and a naturally oxidized film are removed to expose the surface of the epitaxial Si layer 12, and then a second epitaxial silicon layer 17 is grown on the entire surface of the resultant structure. On the side wall SiO$_2$ films 15 and the connection members 16, silicon is epitaxially grown from those portions of the epitaxial Si layer 12 which are adjacent thereto. The epitaxial Si layer 17 has a thickness of, for example, about 50 nm. The epitaxial Si layer 17 may be also formed by depositing silicon to form an amorphous silicon layer, and then re-crystallizing the amorphous silicon layer by a heat treatment.

If necessary, the surface of the epitaxially grown silicon may be subjected to, for example, CMP, thereby to remove the unevenness of the surface of the epitaxial Si layer 17. This treatment will remove the unevenness of the layer 17 formed on the connection holes 14, and hence can enhance the quality of transistors which will be formed later. The epitaxial Si layer 17 may be thinner than the epitaxial Si layer 12 since the former only serves to electrically connect each connection member 16 to the source/drain of a corresponding transistor. Further, deep channel ion implantation (not shown) may be performed before the formation of the epitaxial Si layer 17, for preventing transistors from being punched through. This enables realization of an ideal channel ion implantation profile for the prevention of the punching through.

Figure 10A:
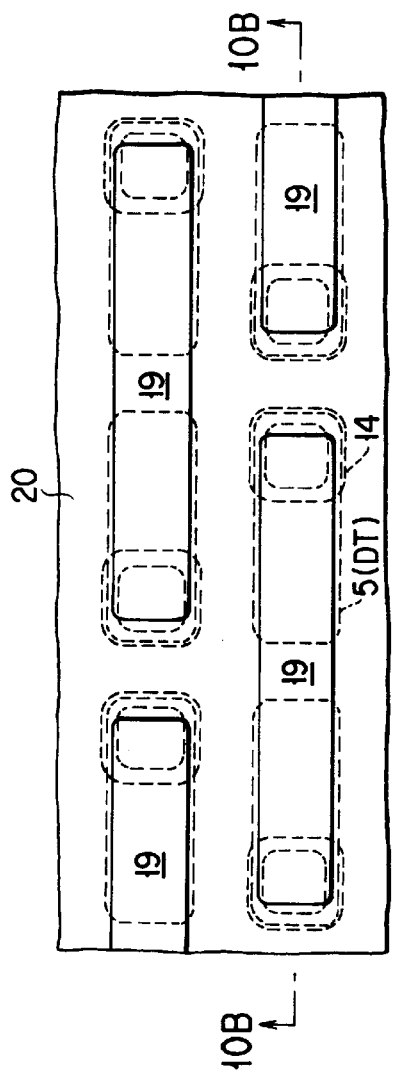
FIG. 10A is a plan view, useful in explaining a method for manufacturing the DRAM of the first embodiment invention.
Figure 10B:
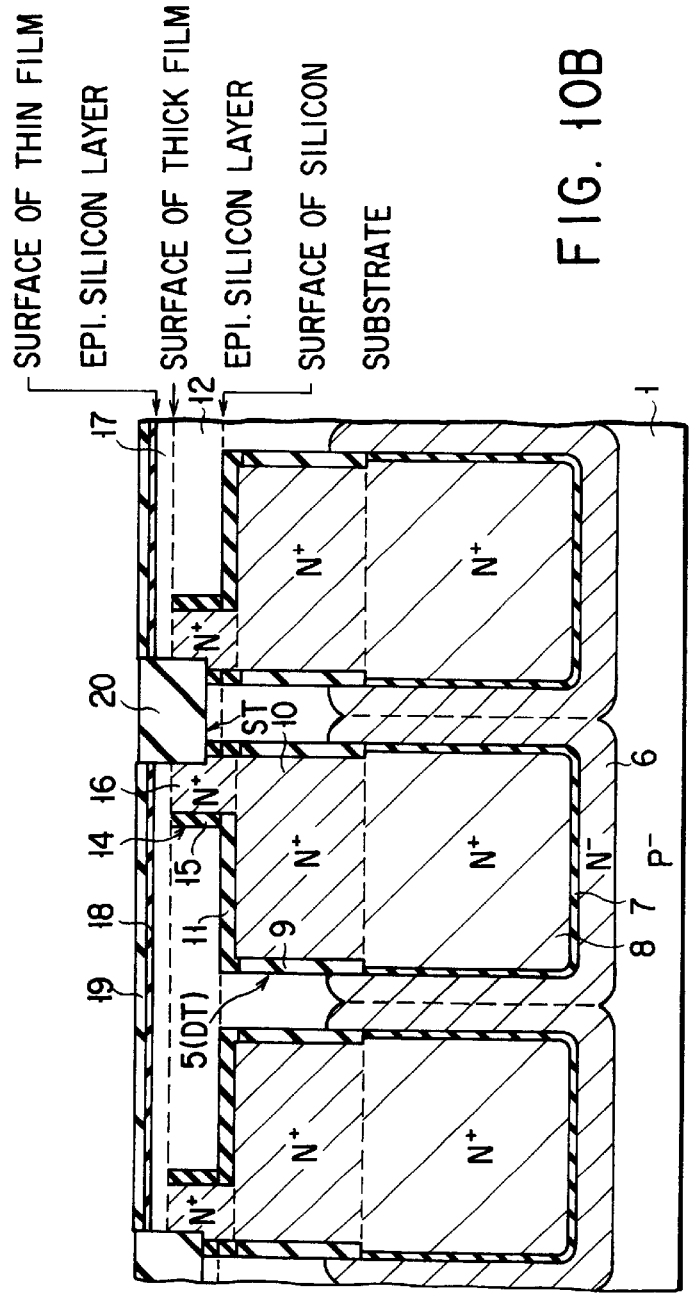
FIG. 10B is a sectional view, taken along the line 10B—10B of FIG. 10A.

Referring then to FIGS. 10A and 10B, a SiO$_2$ film 18 and a Si$_3$N$_4$ film 19 are formed on the epitaxial layer 17. The SiO$_2$ film 18 and the Si$_3$N$_4$ film 19 are mask films to be used for forming STIs. Next, shallow trenches ST with a depth of about 200 nm are formed in the SiO$_2$ film 18, Si$_3$N$_4$ film 19, and epitaxial Si layers 12 and 17 using lithography and RIE. Then, damaged layers, for example, having occurred during RIE are removed from the side and bottom surfaces of the shallow trenches. Thereafter, silicon dioxide is deposited on the entire surface of the resultant structure by CVD using TEOS as a reactive gas, thereby forming a CVD-TEOS film (SiO$_2$) with a thickness of about 300 nm. Subsequently, the CVD-TEOS film is buried in the shallow trenches to form STIs 20.

Figure 11A:
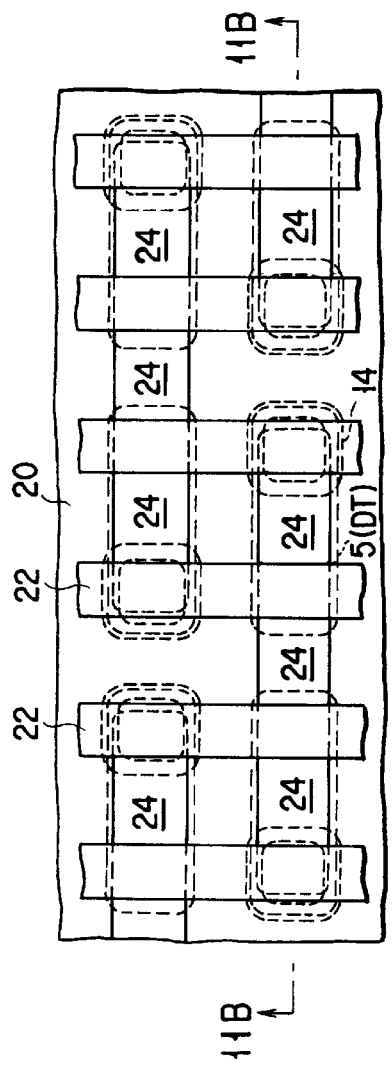
FIG. 11A is a plan view, useful in explaining a method for manufacturing the DRAM of the first embodiment invention.
Figure 11B:
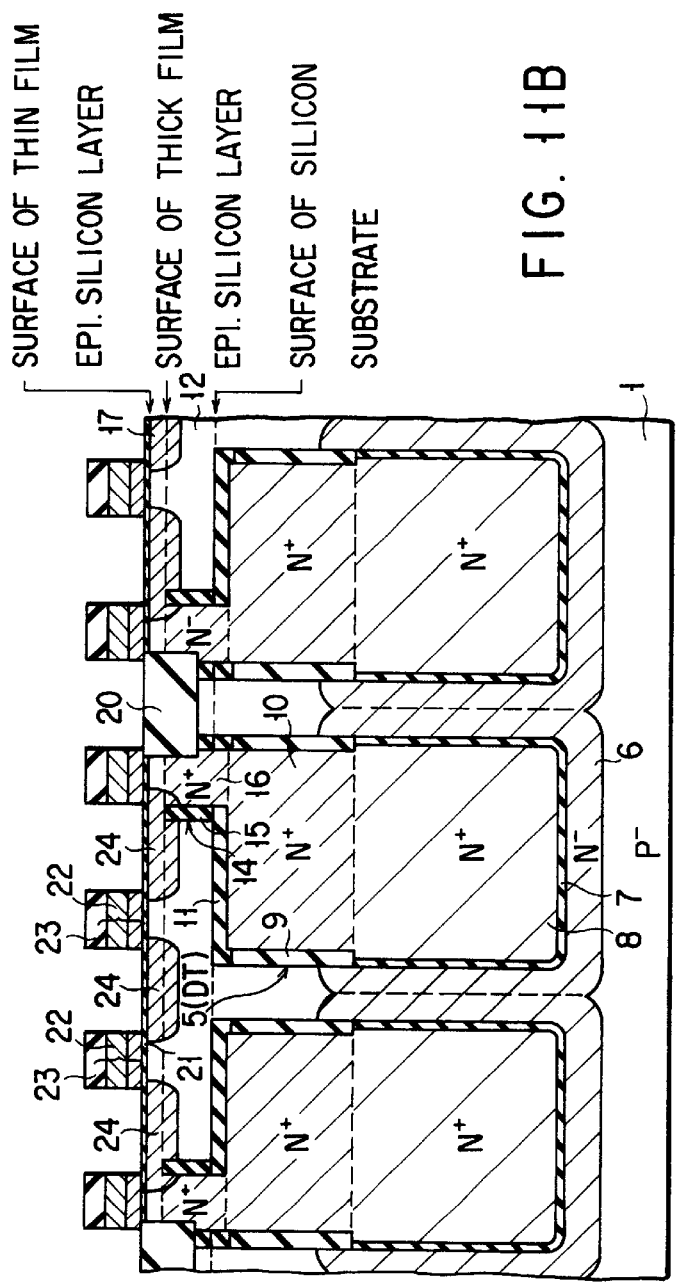
FIG. 11B is a sectional view, taken along the line 11B—11B of FIG. 11A.

Referring to FIGS. 11A and 11B, the Si$_3$N$_4$ film 19 and the SiO$_2$ film 18 are sequentially removed to expose the epitaxial Si layer 17. Then, a SiO$_2$ film 21 with a thickness of about 6 nm is formed on the epitaxial Si layer 17 by thermal oxidation.

After that, a usual process for forming the transistor gate electrodes 22 is performed. Specifically, an N$^+$polysilicon film (thickness: about 50 nm), a tungsten-silicide film (thickness: about 50 nm) and a cap Si$_3$N$_4$ film 23 are sequentially formed. Thereafter, the cap Si$_3$N$_4$ film 23 is processed into a gate electrode pattern (a word line pattern), and then the tungsten-silicide film and the N$^+$polysilicon film are etched to thereby obtain a lamination structure corresponding to the gate electrode pattern. Although in this embodiment, each gate electrode 22 is formed of a lamination film which consists of the tungsten-silicide film and the N$^+$polysilicon film, it may be formed of a single polysilicon film or a lamination film which consists of other types of films. The cap Si$_3$N$_4$ film 23 also serves as a film to be used for a self-aligned contact which will be formed in a later process. A resist mask layer (not shown) is formed which coats each region for forming, for example, a P-channel MOS transistor. Then, phosphor ions (P$^+$) are implanted into each region for forming an N-channel MOS transistor at an acceleration voltage of 70 keV and a dose of 4×10$^{13}$ cm$^{-2}$, using the gate electrode 22 as a mask. As a result, N$^-$-type source/drain diffusion layers 24 are formed.

As is shown in FIGS. 1A and 1B, Si$_3$N$_4$ is deposited on the entire surface of the resultant structure, thereby forming a Si$_3$N$_4$ film with a thickness of about 30 nm. The Si$_3$N$_4$ film is subjected to RIE, thereby forming side wall Si$_3$N$_4$ films 25 on the side walls of a lamination structure including the gate electrodes 22 and the cap Si$_3$N$_4$ films 23. Then, a resist mask layer (not shown) is formed which coats each region for forming, for example, a P-channel MOS transistor. Then, arsenic ions (As$^+$), for example, are implanted into each region for forming an N-channel MOS transistor at an acceleration voltage of 30 keV and a dose of 5×10$^{15}$ cm$^{-2}$, using the gate electrode 22 as a mask. As a result, an N$^+$-type diffusion layer (not shown) is formed. At this time, the source/drain diffusion layers 24 have an LDD (Lightly Doped Drain) structure. Although in this embodiment, the source/drain diffusion layers 24 have the LDD structure, it may have a single source/drain structure which consists only of an N$^-$-type diffusion layer or an N$^+$-type diffusion layer.

Furthermore, although in this embodiment, the formation of the source/drain diffusion layer of the N-channel MOS transistor was described, it suffices if P$^-$ or P$^+$ source/drain diffusion layer is formed, in order to form a source/drain diffusion layer for a P-channel MOS transistor.

Thereafter, silicon nitride is deposited on the entire surface of the resultant structure by CVD to form a CVD-Si$_3$N$_4$ film with a thickness of about 30 nm. As a result, a stopper Si$_3$N$_4$ film 26 is provided. A BPSG film 27 with a thickness of about 500 nm is formed as an interlayer insulating film on the stopper Si$_3$N$_4$ film 26. The resultant structure is subjected to, for example, a heat treatment for about 30 minutes at about 800° C. in the atmosphere of nitrogen gas (N$_2$) to thereby densify it. This heat treatment may serve to activate the source/drain diffusion layers 24, too. Moreover, to minimize the depth (Xj) to the source/drain diffusion layer junctions 24, the densifying temperature is reduced to about 750° C., and then a rapid thermal anneal (RTA) process is performed at 950° C. for ten seconds.

Then, the BPSG film 27 is subjected to CMP to planarize its surface. Contact holes are formed in the stopper $Si_3N_4$ film 26 and the BPSG film 27 such that each of the holes reaches the other of a corresponding pair of the source/drain diffusion layers 24. After that, $N^+$ polysilicon is buried in each contact hole to form a bit line contact 28. A passivation film (not shown) is deposited on the entire surface of the resultant structure, which is the completion of the basic structure of a DRAM.

As described above, in the first embodiment, the epitaxial Si layers 12 and 17 are formed in two process stages on each trench capacitor in the substrate 1. Accordingly, the trench can be formed below the transistor, which means that the trench can have a large area and hence a large capacitance. As a result, the charge of the device can be increased, the memory cell operation margin be increased, and the yield of products be increased.

In addition, the defect level, for example, of the epitaxial Si layer can be suppressed as a result of the two-stage epitaxial growth method. The occurrence of, for example, an oxide film defect in a transistor forming area can be suppressed. In particular, the epitaxial Si layer 12 is epitaxially grown not only on the substrate 1 but also on the stopper insulating film 11. This means that there is dependency of the epitaxial growth upon crystal orientation, and hence there is a possibility of occurrence of facets. The surface unevenness due to the facets will adversely affect the growth of the epitaxial Si layer 17 or lithography performed to form a connection hole.

In the first embodiment, the surface of the epitaxial Si layer 12 is planarized using, for example, CMP. On the surface-planarized epitaxial Si layer 12, highly accurate dimension control can be realized during lithography. Therefore, a resist mask for forming the connection hole 14 can be formed with accuracy.

Further, one of the source/drain diffusion layers 24 is directly connected to the top surface of the connection member 16, which means that the one of the layers 24 is connected to the connection member 16 using the surface strap structure.

As is evident from the aforementioned document (A), the surface strap structure can realize more reliable connection and the process for obtaining the structure is more stable than a buried strap structure which uses only diffusion of an impurity contained in an storage electrode. Accordingly, the surface strap structure can increase the yield of products.

Furthermore, in the first embodiment, the connection member 16 buried in the connection hole 14 is formed of, for example, polysilicon which contains an N-type impurity. In this structure, the N-type impurity contained in the connection member 16 diffuses into the epitaxial Si layer 17. Further, an N-type impurity contained in one of the source/drain diffusion layers 24 diffuses, in particular, into that portion of the epitaxial Si layer 17 which is located below the gate electrode 22. Accordingly, the one of the source/drain diffusion layers 24 is connected to the connection member 16 in a self-aligned manner. This enables omission of a particular connection step and hence simplification of the entire process.

Also, in the first embodiment, the depth Xj to the source/drain diffusion layer junctions 24 is set greater than the depth $T_{17}$ from the surface of the epitaxial Si layer 17 to the top surface of the connection member 16. This enables the formation of the one of the source/drain diffusion layers 24 into the connection member 16, thereby further increasing the reliability of connection.

In addition, in the first embodiment, a flattening step can be employed during forming a trench, isolating an element, forming a transistor, etc. to enhance the flatness of an element-formed surface, which is advantageous to a fine lithography process.

Second Embodiment

In the above-described first embodiment, a side wall $SiO_2$ film 15 of a thickness of about 30 nm is formed on the side walls of the connection hole 14.

If in that case, the DT 5 and the connection hole 14 are misaligned, a groove will be formed which 5 extends along the DT 5 up to the substrate 1 through the epitaxial Si layer 12. Such a groove will cause the substrate 1 to be exposed therethrough in the step of removing the stopper SiN film 11. Where the substrate 1 is exposed, it may be connected to the connection member 16, thereby causing leakage of electricity from the member 16 or short-circuiting.

In the second embodiment, the contact between the connection member 16 and the substrate 1 is suppressed even when the DT 5 and the connection hole 14 are misaligned.

Figure 12A:
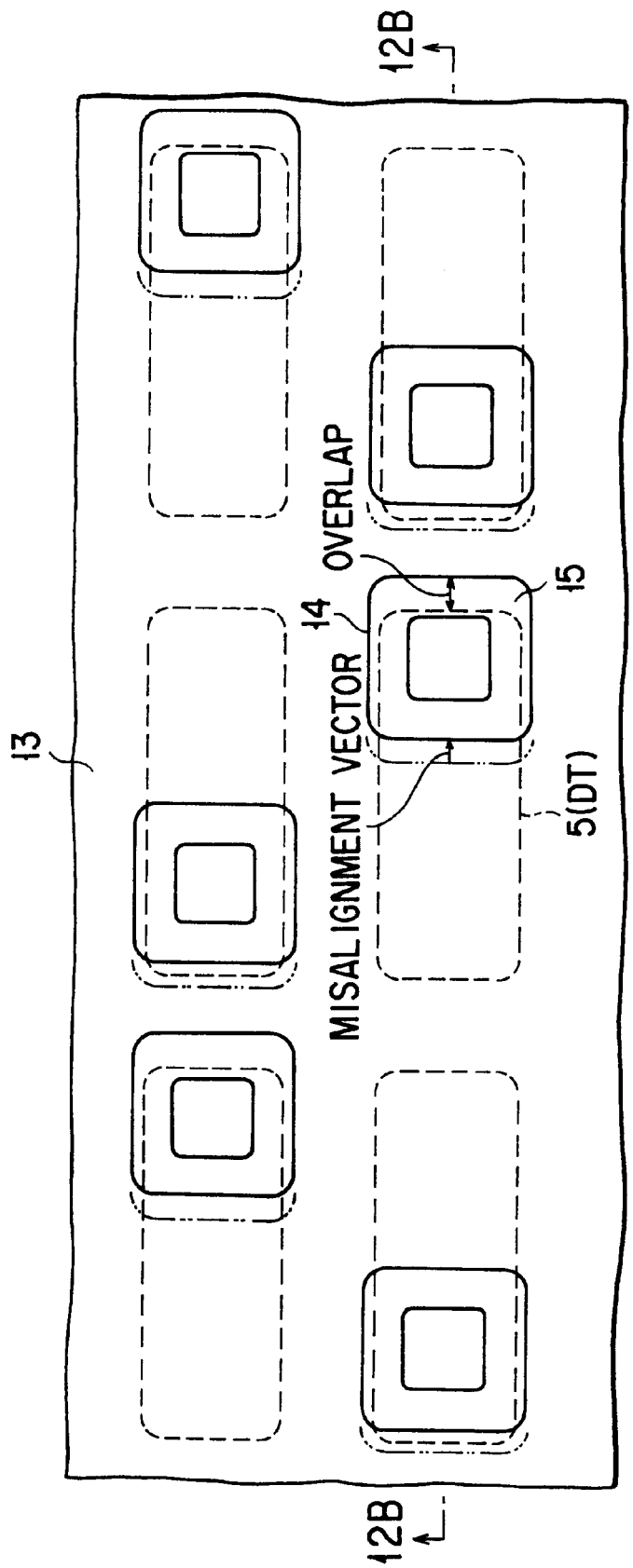
FIG. 12A is a plan view, showing a DRAM according to a second embodiment of the invention.
Figure 12B:
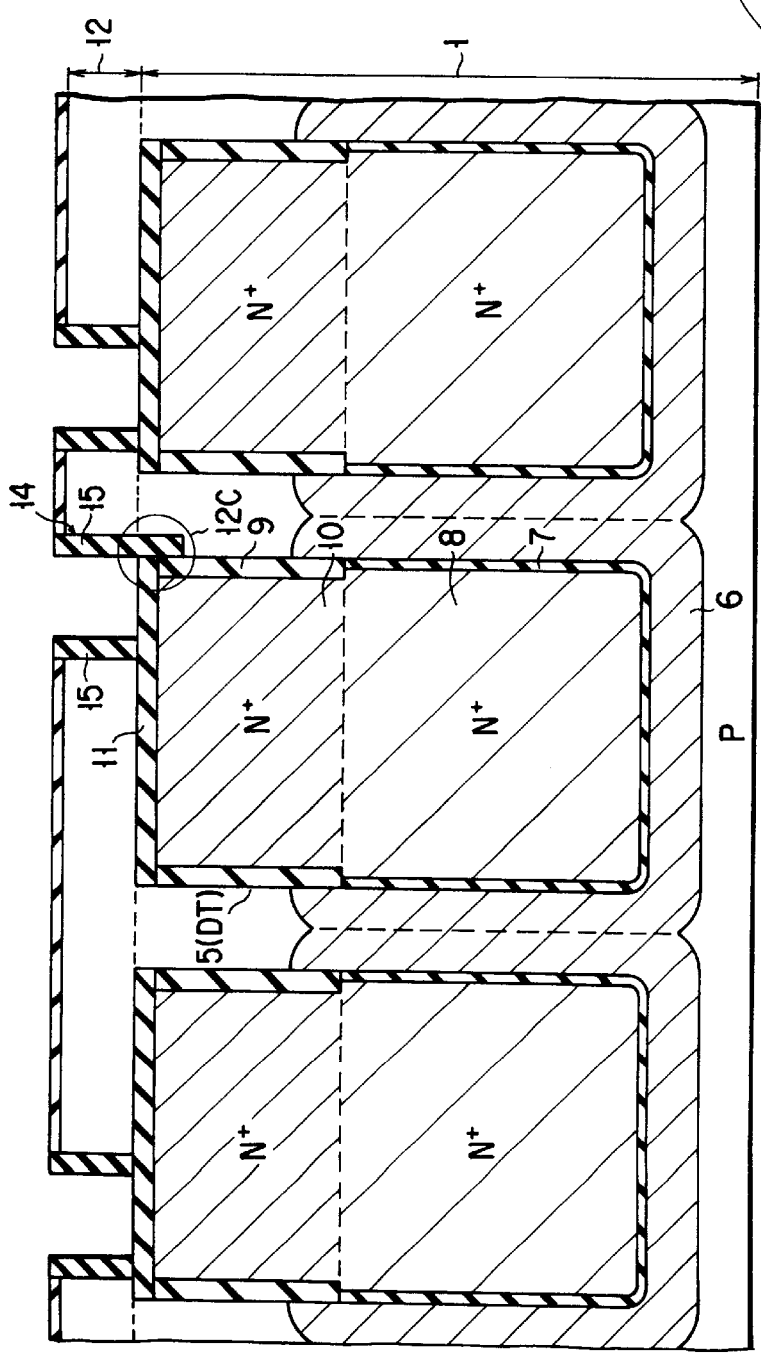
FIG. 12B is a sectional view, taken along the line 12B—12B of FIG. 12A.
Figure 12C:
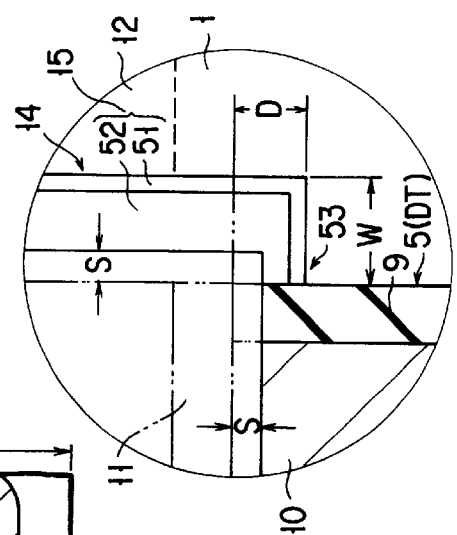
FIG. 12C is an enlarged view of an encircled portion 12C in FIG. 12B.

FIG. 12A is a plan view, showing a DRAM according to a second embodiment of the invention, FIG. 12B is a sectional view, taken along the line 12B—12B of FIG. 12A, and FIG. 12C is an enlarged view of an encircled portion 12C in FIG. 12B. FIGS. 12A and 12B correspond to FIGS. 7A and 7B.

As is shown in FIGS. 12A to 12C, a thermal oxide film 51 with a thickness of, for example, about 6 nm is formed on the portions of the substrate 1 which are exposed in a groove 53 which extends in each connection hole 14 and along a corresponding DT 5. Then, the groove 53 is completely filled with a $CVD-SiO_2$ film 52. To fill the groove 53 with the $CVD-SiO_2$ film 52, the $CVD-SiO_2$ film 52 must have a thickness greater than half the width "W" of the groove 53.

The width "W" of the groove 53 is determined from the alignment accuracy of the DT 5 and the connection hole 14 during lithography. This alignment accuracy during lithography depends upon an exposure unit used, and can be about 50 nm or less. That is, the width "W" of the groove 53 is set less than 50 nm (W<50 nm).

The depth of the groove 53 is determined from the etching period when forming the connection hole 14. It is necessary to prevent the substrate 1 from being exposed through the groove 53 in the step of removing the stopper SiN film 11. To this end, the bottom of the groove 53 is set at a level lower than the upper surface of the storage electrode 10, as is shown in FIG. 12C.

The depth "D" shown in FIG. 12C indicates the depth from the boundary between the stopper SiN film 11 and the storage electrode 10. In the second embodiment, the depth "D" is controlled.

Supposing that the amount of isotropic etching in the collar oxide film 9 or the $CVD-SiO_2$ film 52 performed in the step of removing the stopper SiN film 11 is "S", D->S must be satisfied. In light of, for example, the rate of etching in the $CVD-SiO_2$ film 52, it is advantageous to form an insulating film to be filled in the groove 53, of a lamination film which consists of the thermal oxide film 51 and the $CVD-SiO_2$ film 52.

In consideration of fluctuation of etching when forming the connection hole 14 and when removing the stopper SiN film 11, the depth "D" is given by D=3×S+'etching fluctuation'

Where the etching amount "S" is tripled, the etching fluctuation when removing the stopper SiN film 11 can be completely ignored.

When the etching amount "S" is about 5 nm,

D=3×5 nm+30 nm=45 nm

Thus, the depth "D" is determined to be about 45 nm.

30 nm indicates the range of etching fluctuations which occur when the connection hole 14 is formed.

In the second embodiment, the width "W" and depth "D" of the groove 53 formed as a result of misalignment of the DT 5 and the connection hole 14 are controlled as above, whereby the thermal oxide film 51 or the CVD-SiO$_2$ film 52 can be left on the bottom and side surfaces of the groove 53. Therefore, leakage of electricity between the substrate 1 and the member 16 or short-circuiting can be avoided, thereby increasing the yield of products.

Third Embodiment

Figure 13A:
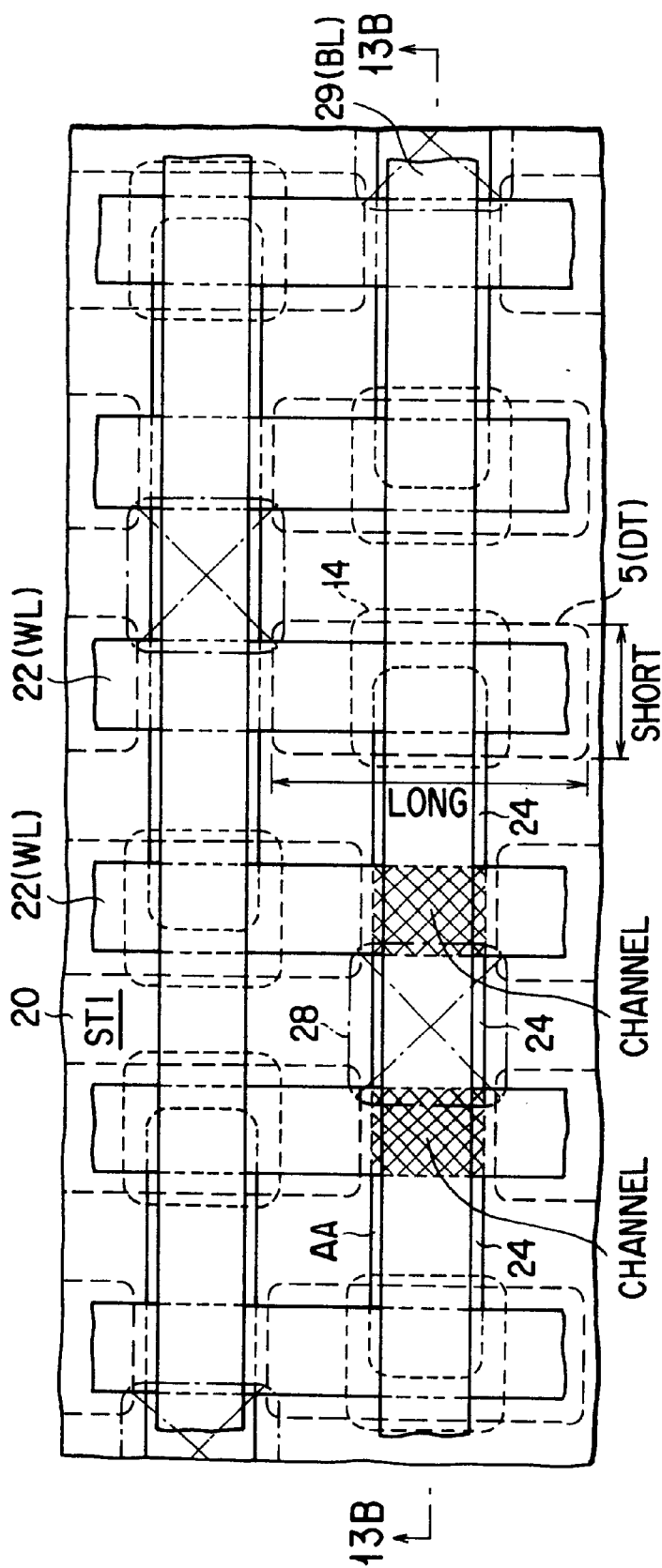
FIG. 13A is a plan view, showing a DRAM according to a third embodiment of the invention.
Figure 13B:
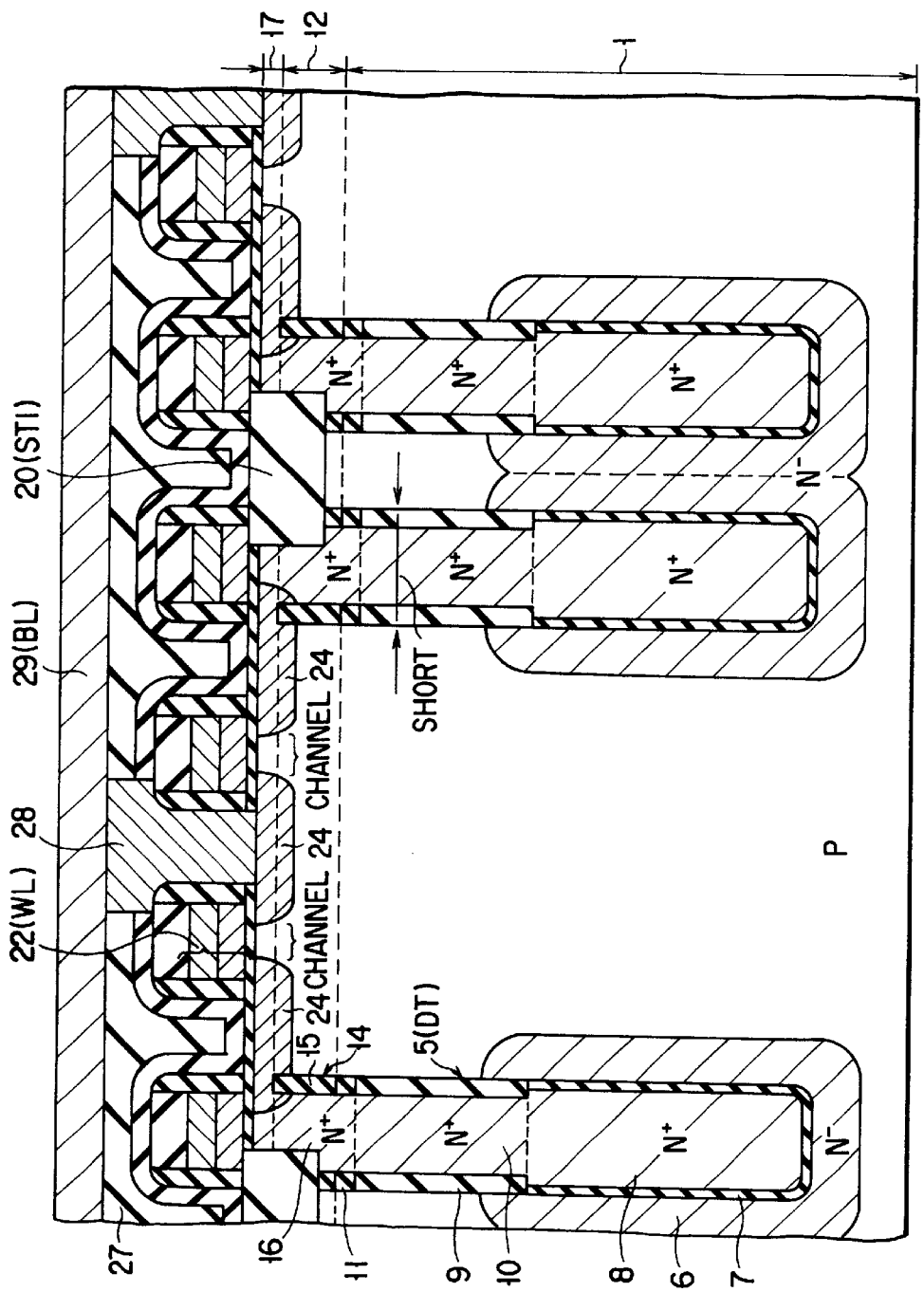
FIG. 13B is a sectional view, taken along the line 13B—13B of FIG. 13A.

FIG. 13A is a plan view, showing a DRAM according to a third embodiment of the invention, and FIG. 13B is a sectional view, taken along the line 13B—13B of FIG. 13A.

The basic structure of the third embodiment is the same as that of the first embodiment. They differ from each other in the arrangement of DTs 5 which are shaped rectangular have long sides "LONG" and short sides "SHORT" when their plan view is seen.

In the first embodiment, the long sides "LONG" of the DT 5 are parallel to the bit line 29. On the other hand, in the third embodiment, the long sides "LONG" of the DT 5 are parallel to the gate electrode 22 (word line).

In the DT arrangement of the third embodiment, the channel of each transistor can be disposed in an area separate from an upper area of a corresponding DT 5. In this case, the substrate 1 is disposed below the channel of each transistor. The substrate 1 is formed of monocrystalline silicon, on which an epitaxial Si layer of an excellent quality can be expected to grow. Accordingly, the channel of the transistor can be formed of a high quality semiconductor layer. This means that high quality transistors can be manufactured, in which degradation of, for example, carrier mobility as a factor for determining the characteristics of each transistor is minimized.

The invention is not limited to the above-described embodiments. The material of the substrate and the first and second semiconductor layers provided thereon is not limited to silicon but may be another kind of semiconductor. Moreover, the material of the storage electrode or to-be-connected electrode of the capacitor, or the materials of various types of insulating films can be changed in accordance with the specifications of devices.

Furthermore, although in the embodiments, the collar oxide film 9 is formed in an upper area of the DT 5, the capacitor insulating film 7 may be provided on all the side and bottom surfaces of the DT 5. Since in this case, shallow DTs 5 can be formed, a series of process steps of forming the DTs can be simplified, and hence the manufacturing cost can be significantly reduced. In addition, the invention can be modified in various manners without departing from its scope.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a semiconductor substrate having a trench;
   a capacitor having a storage electrode formed in the trench;
   a first epitaxial semiconductor layer formed on the semiconductor substrate and the capacitor, the first epitaxial semiconductor layer being electrically isolated from the storage electrode and having a hole extending to the storage electrode, the first epitaxial semiconductor layer being in contact with the semiconductor substrate;
   a connection member formed in the hole and electrically isolated from the first epitaxial semiconductor layer in a substrate in-plane direction;
   a second epitaxial semiconductor layer formed on a surface of the first epitaxial semiconductor layer and a surface of the connection member, where the surface of the first epitaxial semiconductor layer and the surface of the connection member on which the second epitaxial semiconductor layer is formed are co-planar and parallel to said substrate in-plane direction;
   a transistor formed on the second epitaxial semiconductor layer, and having a source and a drain in the second epitaxial semiconductor layer, one of the source and the drain being connected to the connection member in a direction of lamination of the substrate and the layers.

2. A semiconductor integrated circuit device according to claim 1, wherein the connection between the one of the source and the drain of the transistor and the connection member is a surface strap.

3. A semiconductor integrated circuit device according to claim 2, wherein the side walls of the hole are coated with an insulating film.

4. A semiconductor integrated circuit device according to claim 3, wherein the insulating film has a lamination structure which consists of a CVD oxide film and a thermal oxide film.

5. A semiconductor integrated circuit device according to claim 2, wherein when the hole overlaps the semiconductor substrate, the bottom surface of the hole is at a level lower than the top surface of the storage electrode, and the side and bottom surfaces of the hole are coated with an insulating film.

6. A semiconductor integrated circuit device according to claim 5, wherein the insulating film has a lamination structure which consists of a CVD oxide film and a thermal oxide film.

7. A semiconductor integrated circuit device according to claim 2, wherein the gate of the transistor serves as a word line, and the transistor is a transfer transistor which is responsive to the potential of the word line for electrically connecting the storage electrode of the capacitor to a bit line.

8. A semiconductor integrated circuit device according to claim 7, wherein the shape of the trench is a rectangle with long and short sides when a plan view of the trench is seen, and the long sides of the trench are parallel to the bit line.

9. A semiconductor integrated circuit device according to claim 7, wherein the shape of the trench is a rectangle with long and short sides when a plan view of the trench is seen, the long sides of the trench being parallel to the word line, and the channel of the transistor being formed above the semiconductor substrate.

10. A semiconductor integrated circuit device according to claim 2, wherein the second epitaxial semiconductor layer is thinner than the first epitaxial semiconductor layer.

11. A semiconductor integrated circuit device according to claim 2, wherein the first epitaxial semiconductor layer is planarized.

12. A semiconductor integrated circuit device according to claim 2, wherein a depth to junctions of the source and the drain is greater than a depth from the surface of the second epitaxial semiconductor layer to the top surface of the connection member.

13. A semiconductor integrated circuit device comprising:
    a semiconductor substrate having a trench;
    a capacitor insulating film formed in the trench;
    a storage electrode formed in the trench with the capacitor insulating film interposed therebetween;
    a stopper insulating film formed on the storage electrode;
    a first epitaxial semiconductor layer formed on the semiconductor substrate and the stopper insulating film, the first epitaxial semiconductor layer being in contact with the semiconductor substrate;
    a connection hole formed in the first epitaxial semiconductor layer and reaching the storage electrode;
    a side wall insulating film formed on side walls of the connection hole;
    a connection member formed in the connection hole and connected to the storage electrode;
    a second epitaxial semiconductor layer formed on a surface of the first epitaxial semiconductor layer and a surface of the connection member, where the surface of the first epitaxial semiconductor layer and the surface of the connection member on which the second epitaxial semiconductor layer is formed are co-planar and parallel to a substrate in-plane direction; and
    a transistor formed on the second epitaxial semiconductor layer, and having a source and a drain in the second epitaxial semiconductor layer, one of the source and the drain being connected to the connection member.

14. A semiconductor integrated circuit device according to claim 13, wherein the stopper insulating film is formed of an insulating material which differs from the material of the side wall insulating film.

15. A semiconductor integrated circuit device according to claim 14, wherein the stopper insulating film contains silicon nitride, and the side wall insulating film contains silicon oxide.

16. A semiconductor integrated circuit device according to claim 13, wherein the side wall insulating film has a lamination structure.

17. A semiconductor integrated circuit device according to claim 16, wherein the side wall insulating film includes a thermal oxide film and a CVD oxide film.

18. A semiconductor integrated circuit device according to claim 13, further comprising a collar insulating film formed in the trench and made of an insulating material which differs from the material of the capacitor insulating film.

19. A semiconductor integrated circuit device according to claim 18, wherein the collar insulating film is thicker than the capacitor insulating film.

20. A semiconductor integrated circuit device according to claim 18, wherein the capacitor insulating film has a lamination structure.

21. A semiconductor integrated circuit device according to claim 20, wherein the capacitor insulating film includes a silicon nitride film and a silicon oxide film, and the collar insulating film includes a silicon oxide film.

\* \* \* \* \*